United States Patent
Lee et al.

(10) Patent No.: US 9,573,235 B2
(45) Date of Patent: Feb. 21, 2017

(54) TRANSFER UNIT OF TEST HANDLER AND METHOD OF OPERATING THE SAME

(71) Applicant: Samsung Electronics Co., Ltd, Suwon-si, Gyeonggi-do (KR)

(72) Inventors: Jong-An Lee, Asan-si (KR); Bum-Sic Kim, Cheonan-si (KR); Young-Gil Lee, Asan-si (KR); Chea-Geun Lim, Asan-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 599 days.

(21) Appl. No.: 13/894,608

(22) Filed: May 15, 2013

(65) Prior Publication Data
US 2014/0030047 A1    Jan. 30, 2014

(30) Foreign Application Priority Data
Jul. 30, 2012 (KR) .......... 10-2012-0083256

(51) Int. Cl.
*B23Q 15/22* (2006.01)
*B25J 17/02* (2006.01)
*G01R 31/28* (2006.01)

(52) U.S. Cl.
CPC .......... *B23Q 15/22* (2013.01); *B25J 17/0208* (2013.01); *G01R 31/2867* (2013.01)

(58) Field of Classification Search
CPC . B25J 5/02; B25J 9/0009; B25J 9/0018; B25J 9/023; B25J 9/026; B25J 15/0047;
(Continued)

(56) References Cited

U.S. PATENT DOCUMENTS 4,179,783 A * 12/1979 Inoyama ............... B23P 19/102
                                                  29/281.5
5,012,364 A *  4/1991 Hirayama ........... G11B 25/066
                                                  360/85
(Continued)

FOREIGN PATENT DOCUMENTS

CN     1017767095     7/2010
CN      102136440     7/2011
(Continued)

OTHER PUBLICATIONS

Office Action from the Chinese Patent Office for CN Patent Application 201310320828.0 dated Oct. 9, 2016.

*Primary Examiner* — Michael McCullough
*Assistant Examiner* — Brendan Tighe
(74) *Attorney, Agent, or Firm* — Muir Patent Law, PLLC

(57) ABSTRACT

A transfer unit of a test handler includes a base frame, a floating assembly, and an arm part. The base frame includes an inserted portion having a penetration hole. The inserted portion including an upper inserted portion disposed near an upper surface of the inserted portion, a lower portion disposed near a lower portion of the inserted portion and a middle inserted portion disposed between the upper inserted portion and the lower inserted portion. The floating assembly is inserted in the penetration hole of the base frame. The floating assembly includes a floating part, an elastic element, and a coupling element. The floating assembly moves back and forth, to left and right sides, and up and down, or flows within a predetermined angle range in the penetration hole.

16 Claims, 15 Drawing Sheets

(58) Field of Classification Search
CPC .. B25J 15/009; B25J 17/0208; B25J 17/0225;
B25J 17/0233; B65G 49/07; G01R 31/26;
G01R 31/2867; G03F 7/70733; G03F
7/7075; G03F 7/70775; G03F 7/70975;
G03F 7/70991; H01L 21/67724; H01L
21/67733; H01L 21/67742; H01L
21/67766; H01L 21/6875; H01L 29/93;
Y10S 414/135; Y10S 414/136
USPC ...... 324/757.01; 414/749.6; 901/45; 269/58;
403/13
See application file for complete search history.

(56) References Cited

U.S. PATENT DOCUMENTS

| | | | |
|---|---|---|---|
| 5,812,409 A | | 9/1998 | Kanno et al. |
| 8,038,136 B2 * | | 10/2011 | Sanemasa ......... H01L 21/68707 269/58 |
| 2009/0050448 A1 | | 2/2009 | Lee |
| 2009/0199395 A1 | | 8/2009 | Shim et al. |

FOREIGN PATENT DOCUMENTS

| | | | | |
|---|---|---|---|---|
| CN | 102299088 | | 12/2011 | |
| KR | 20090108387 | * | 10/2009 | ............. G01R 31/26 |

* cited by examiner

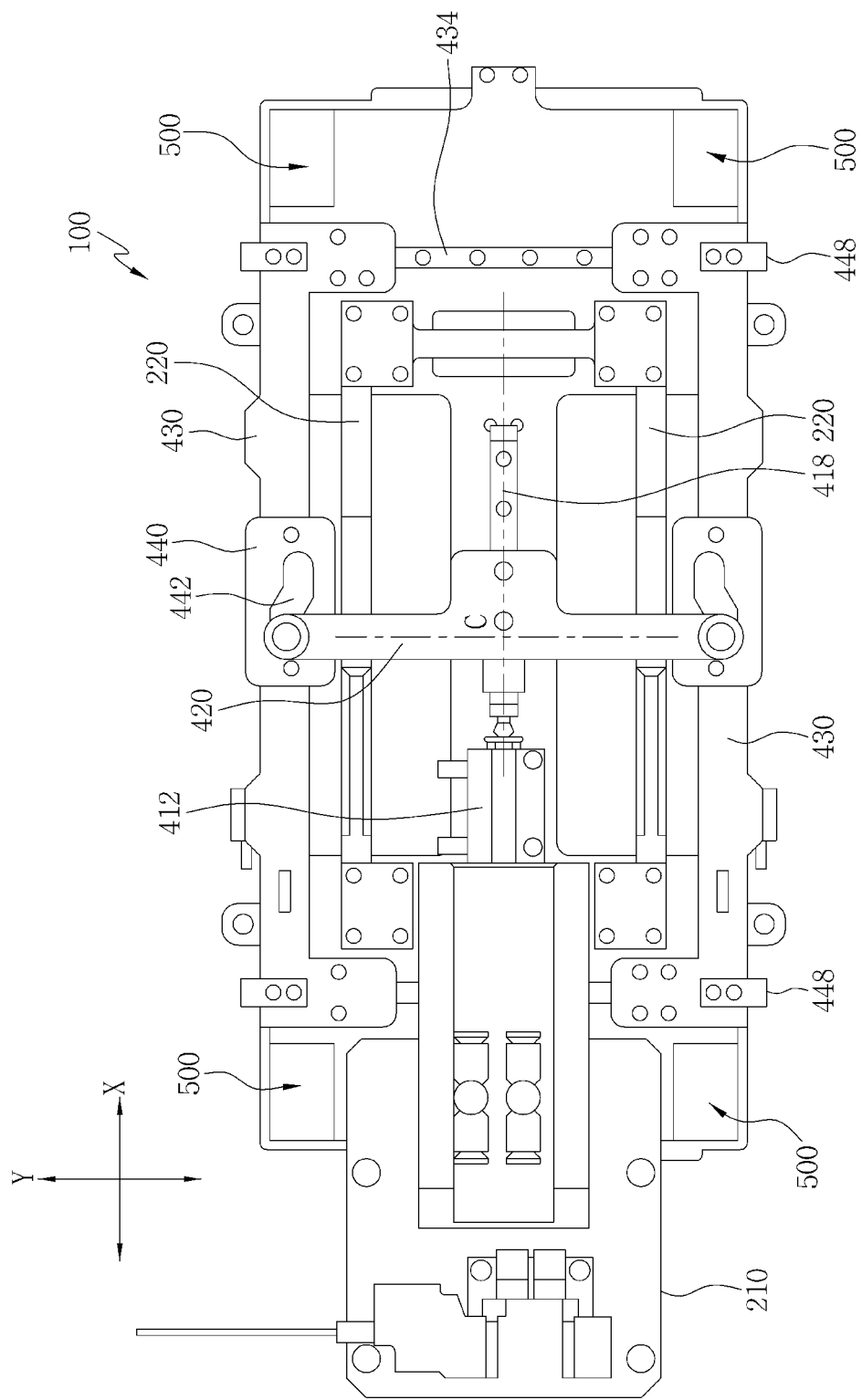

TRANSFER UNIT OF TEST HANDLER AND METHOD OF OPERATING THE SAME

CROSS-REFERENCE TO RELATED APPLICATIONS

This application claims priority under 35 U.S.C. §119 to Korean Patent Application No. 10-2012-0083256 filed on Jul. 30, 2012, the disclosure of which is hereby incorporated by reference in its entirety.

BACKGROUND OF THE INVENTION

1. Field of the Invention

Embodiments of the inventive concept relate to a transfer unit of a test handler to test a produced semiconductor device.

2. Description of the Related Art

A test handler is equipment that is docked on a tester for providing an environment to perform tests and classify semiconductor devices into non-defectives and defectives, in order to test electrical characteristics and functions, and reliability of semiconductor devices that are manufactured through predetermined manufacturing processes.

SUMMARY OF THE INVENTION

Embodiments of the inventive concept provide a transfer unit of a test handler, which is capable of exactly holding or releasing hold of a test tray even in a state where the test tray is inclined, and a method of operating the transfer unit.

Embodiments of the inventive concept also provide a transfer unit of a test handler, which does not cause shaking or trembling of a test tray while moving, and a method of operating the transfer unit.

Additional features and utilities of the present general inventive concept will be set forth in part in the description which follows and, in part, will be obvious from the description, or may be learned by practice of the general inventive concept.

In accordance with exemplary embodiments of the inventive concept, a transfer unit of a test handler includes: a base frame, a floating assembly, and an arm part. The base frame may include a first inserted portion having a penetration hole. The first inserted portion may include an upper inserted portion disposed near an upper surface of the first inserted portion, a lower portion disposed near a lower portion of the first inserted portion and a middle inserted portion disposed between the upper inserted portion and the lower inserted portion. An inner diameter of the upper inserted portion may be larger than an inner diameter of the lower inserted portion. The floating assembly may be inserted in the penetration hole. The floating assembly may include a floating part, an elastic element, and a coupling element. The floating assembly may move back and forth, to left and right sides, and up and down, or may flow within a predetermined angle range in the penetration hole.

In an exemplary embodiment of the inventive concept, the transfer unit of a test handler includes location detection units and a controller. The location detection unit may include a sensor dog contacting an upper portion of the test tray when holding the test tray. A sensor detecting whether the test tray is contact with the sensor dog, may be located on the sensor dog. The sensor may transmit an electric signal to the controller when the test tray is not contact with the sensor dog.

In accordance with exemplary embodiments of the inventive concept, a transfer unit of a test handler comprises: a base frame including first inserted portions at opposite ends thereof, each first inserted portion including a penetration hole; a floating assembly inserted in each penetration hole, the floating assembly including a floating part, an elastic element disposed at an upper end of the floating part, and a coupling element coupling to a lower portion of the floating part; an arm part coupled to the coupling element of each floating assembly such that the arm part adjusts a height of each of four sides individually and is capable of moving in sideway directions when making contact with a test tray to be picked up and transferred.

In an exemplary embodiment, each first inserted portion includes an upper inserted portion disposed near an upper surface of the inserted portion, a lower inserted portion disposed near a lower portion of the inserted portion and a middle inserted portion disposed between the upper inserted portion and the lower inserted portion, and an inner diameter of the upper inserted portion is larger than an inner diameter of the lower inserted portion.

In an exemplary embodiment, the floating part comprises: a body including a female screw portion coupled to the coupling element in a lower portion thereof; and a first projection protruding from side surfaces of the body, the first projection having an outer diameter larger than an inner diameter of the middle inserted portion.

In an exemplary embodiment, a first inserted portion is disposed at each of four corners of the base frame.

In an exemplary embodiment, the arm part comprises: an arm base including an upper portion coupled to the floating assembly via the respective coupling element, and a lower portion to contact a test tray, the arm base having a plate shape; picking elements installed on the upper portion of the arm base to hold the test tray or to release holding of the test tray while reciprocating a predetermined distance; and guide rails in which the picking elements reciprocate.

BRIEF DESCRIPTION OF THE DRAWINGS

The foregoing and other features and utilities of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings:

FIG. 6 is a plan view of a transfer unit of a test handler in accordance with embodiments of the inventive concept;

DETAILED DESCRIPTION OF THE PREFERRED EMBODIMENTS

Figure 1:
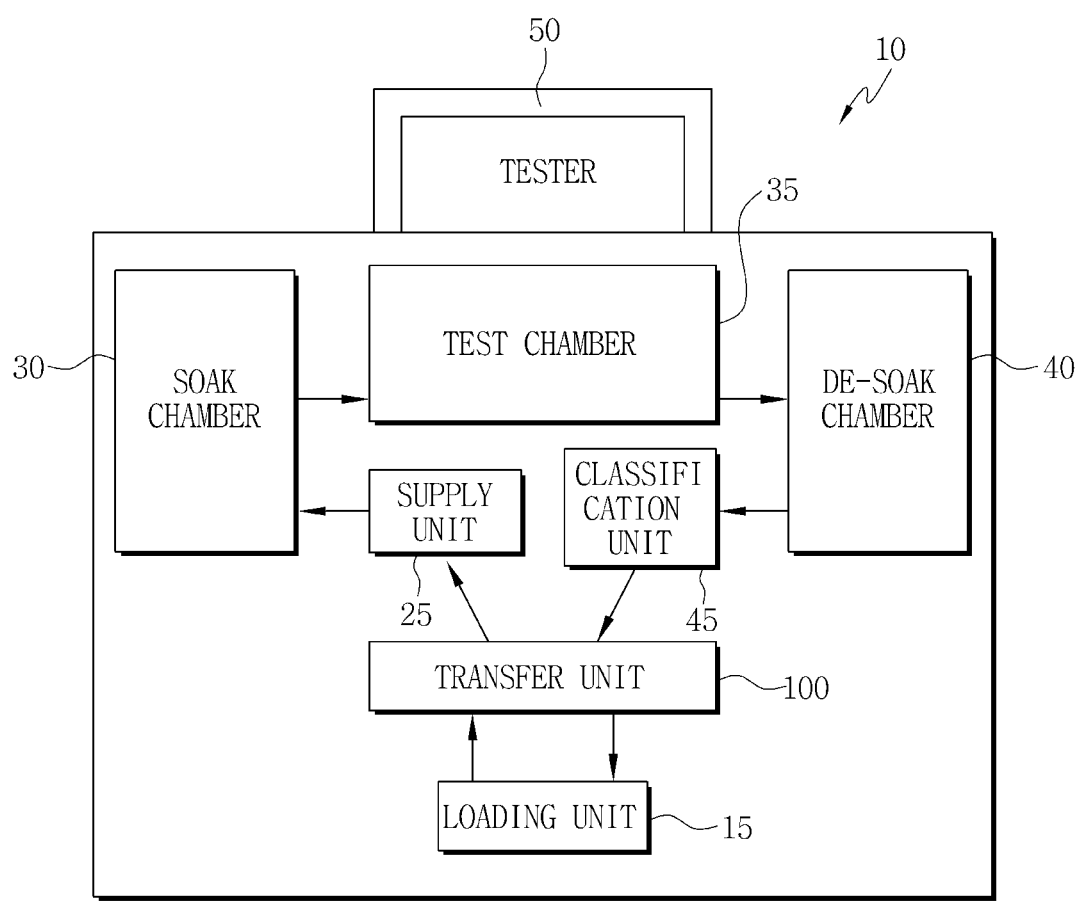
FIG. 1 is a schematic block diagram of a test handler in accordance with embodiments of the inventive concept.

Various embodiments will now be described more fully with reference to the accompanying drawings in which some embodiments are shown. These inventive concepts may, however, be embodied in different forms and should not be construed as limited to the embodiments set forth herein. Rather, these embodiments are provided so that this disclosure is thorough and complete and fully conveys the inventive concept to those skilled in the art. In the drawings, the sizes and relative sizes of layers and regions may be exaggerated for clarity.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic block diagram showing a test handler 10 in accordance with embodiments of the inventive concept.

Referring to FIG. 1, the test handler 10 according to an embodiment of the inventive concept may include a loading unit 15, a transfer unit 100, a supply unit 25, a soak chamber 30, a test chamber 35, a de-soak chamber 40, and a classification unit 45.

The test handler 10 may support semiconductor devices disposed on a test tray to be tested by a tester 50. The test handler 10 may classify the test tray including the semiconductor devices that have been tested according to test grades.

The loading unit 15 may include at least one container. The test tray including semiconductor devices that are not tested yet, or that have been tested may be stacked in the container of the loading unit 15. For example, the test tray including semiconductor devices that have been tested, may be stacked by the tested grades.

The transfer unit 100 may transfer a test tray from the loading unit 15 to the supply unit 25 to test the test tray. The transfer unit 100 may transfer the test tray from the classification unit 45 to the loading unit 15 after the test and classification are finished.

The supply unit 25 may electrical test the semiconductor devices of the test tray. The supply unit 25 may check operation of the semiconductor devices on the test tray.

The soak chamber 30 may pre-treat the test tray. For example, the soak chamber 30 may heat or cool down the test tray to a first temperature. The soak chamber 30 may supply the test tray to the test chamber 35 after the test tray is heated or cooled to the first temperature.

The test chamber 35 may test the electrical characteristics and functions, and reliability of the semiconductor devices disposed on the test tray. The test chamber 35 may include a plurality of sockets. The test tray may be inserted in one socket among the plurality of sockets. For example, a plurality of the sockets may be arranged in a vertical direction. The test chamber 35 may sequentially test the test trays inserted in the plurality of sockets by the tester 50.

The de-soak chamber 40 may post-treat the test tray. For example, the de-soak chamber 40 may heat or cool down the test tray transferred from the test chamber 35 to a second temperature. The second temperature may differ from the first temperature.

The classification unit 45 may classify the test tray according to a test result of the supply unit 25 and the test chamber 35. For example, the classification unit 45 may classify the test tray as a good device or a defective device.

Hereinafter, a transfer unit of a test handler in accordance with an embodiment of the inventive concept and a method of operating the transfer unit will be described in more detail with reference to the accompanying drawings.

Figure 2:
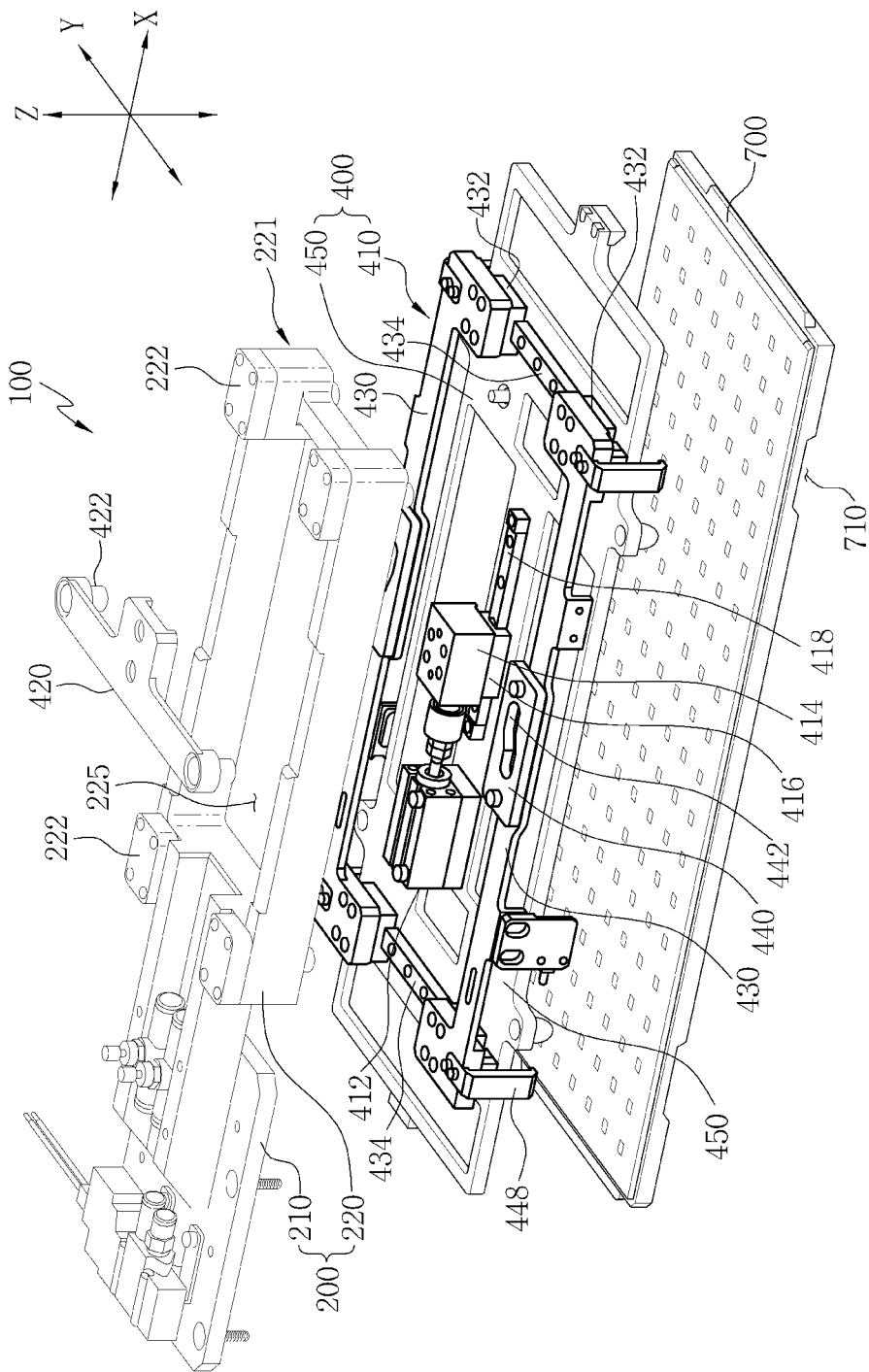
FIG. 2 is an exploded perspective view of a transfer unit of a test handler in accordance with embodiments of the inventive concept.
Figure 3:
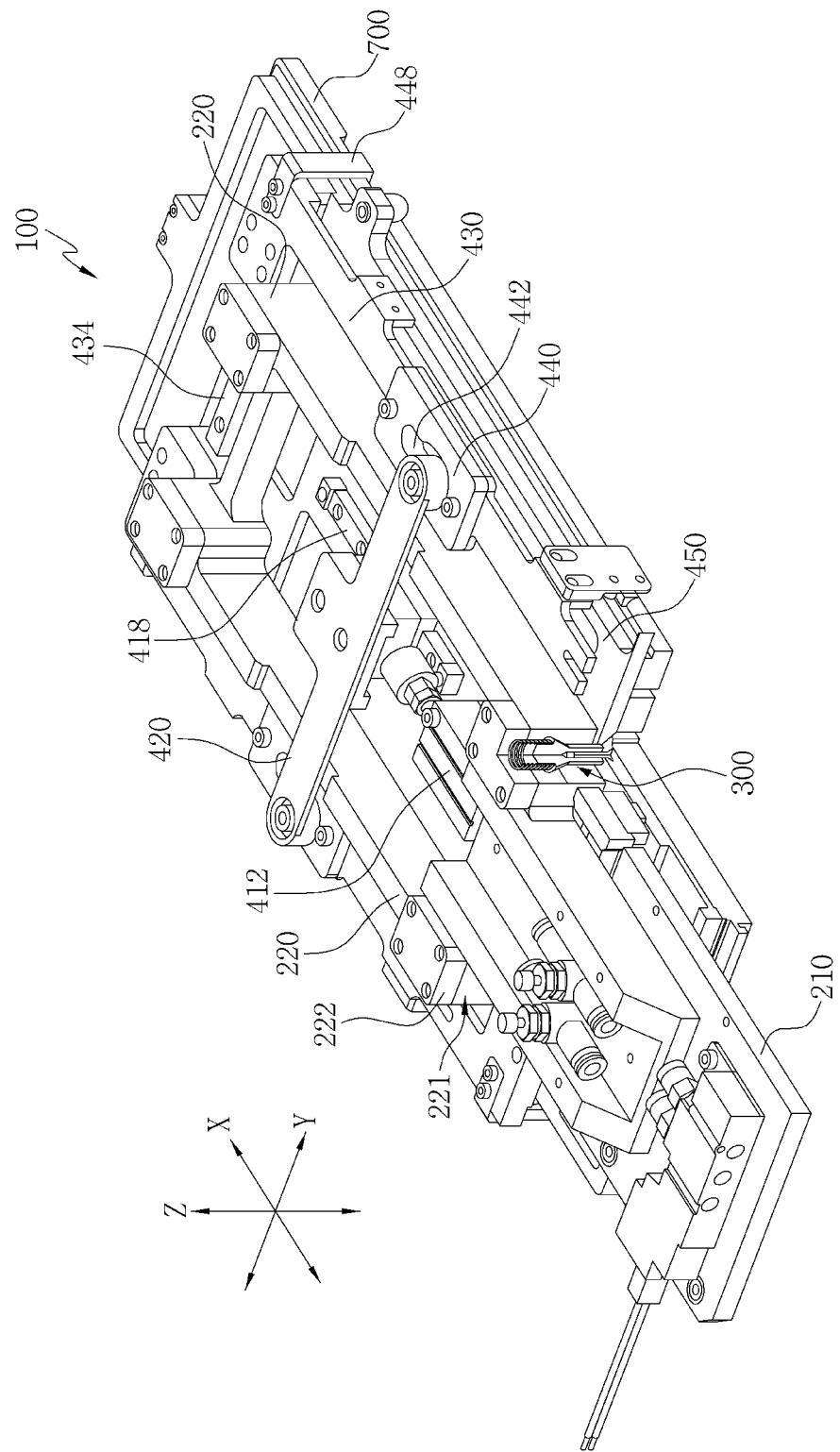
FIG. 3 is a partially cut perspective view of a floating assembly in a transfer unit of a test handler in accordance with embodiment of the inventive concept.
Figure 4:
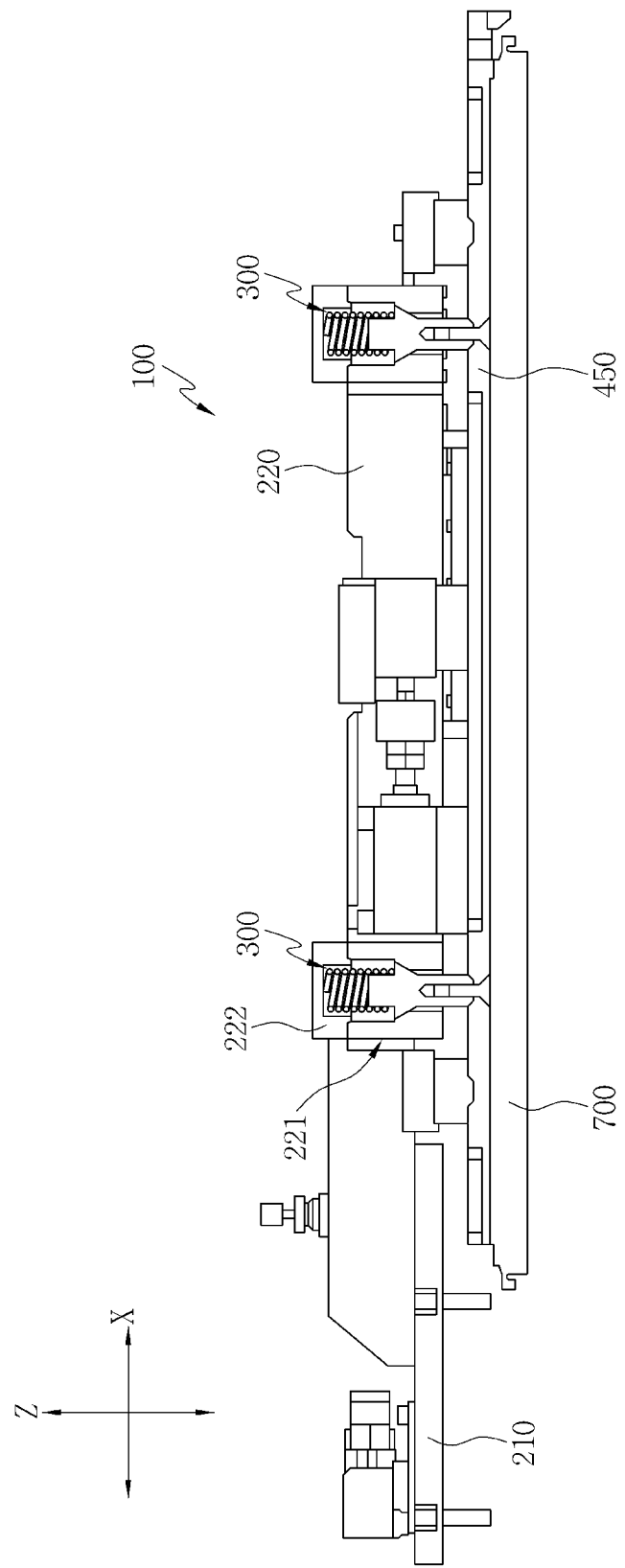
FIG. 4 is a cross-sectional view of a transfer unit of a test handler in accordance with embodiments of the inventive concept.
Figure 5A:
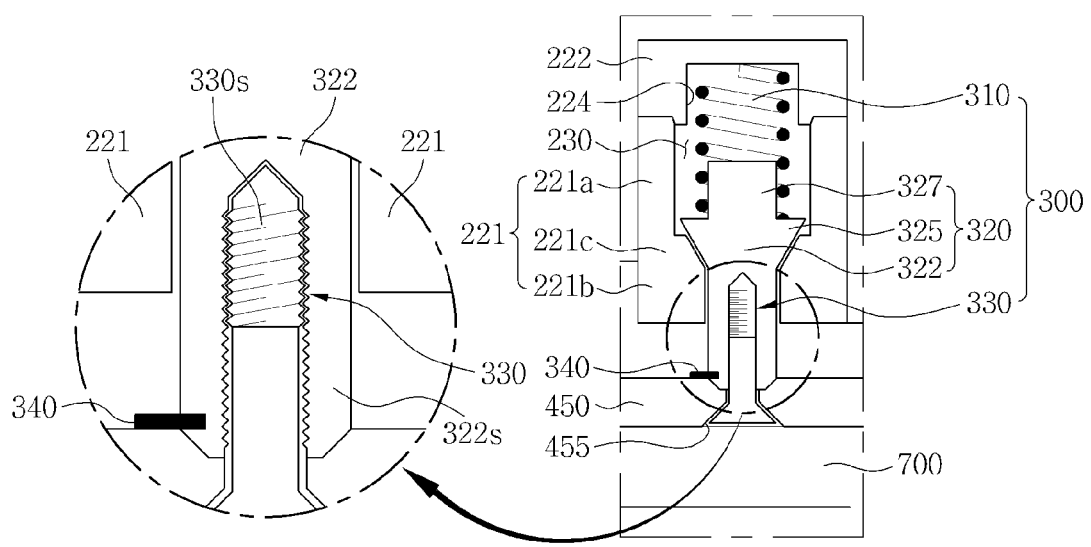
FIGS. 5A and 5B are cross-sectional views showing an expanded view of a floating assembly of a transfer unit in accordance with embodiments of the inventive concept.
Figure 5B:
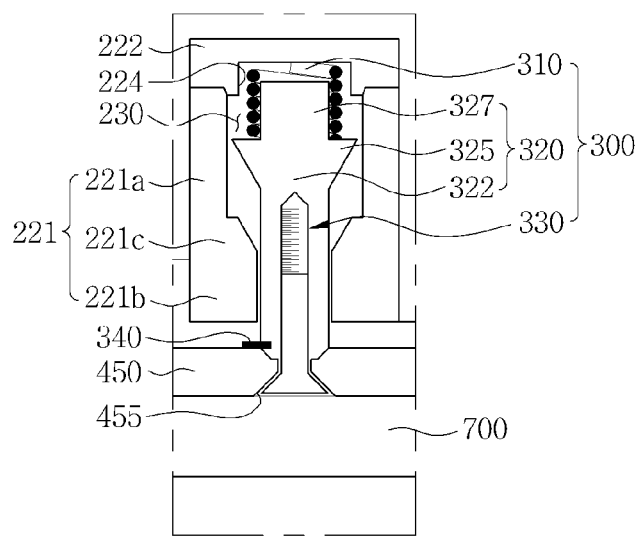
Figure 7:
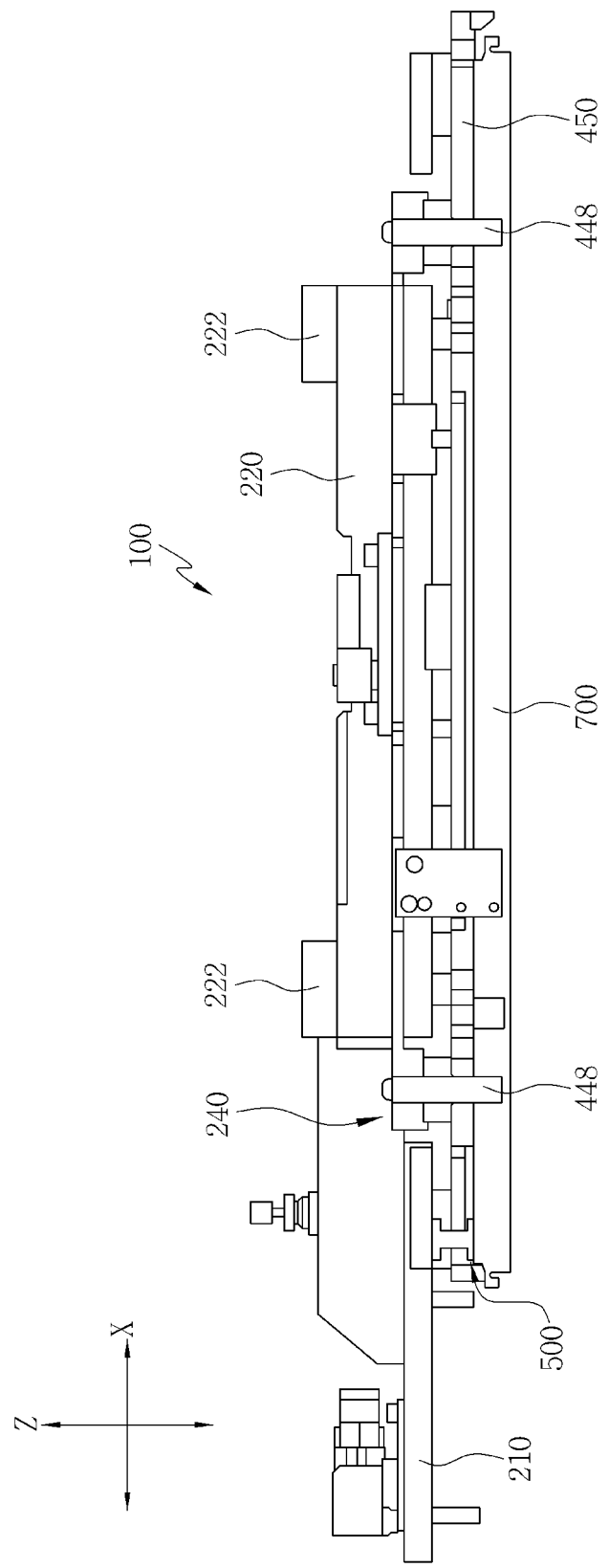
FIG. 7 is a front view of a transfer unit of a test handler in accordance with embodiments of the inventive concept.
Figure 8:
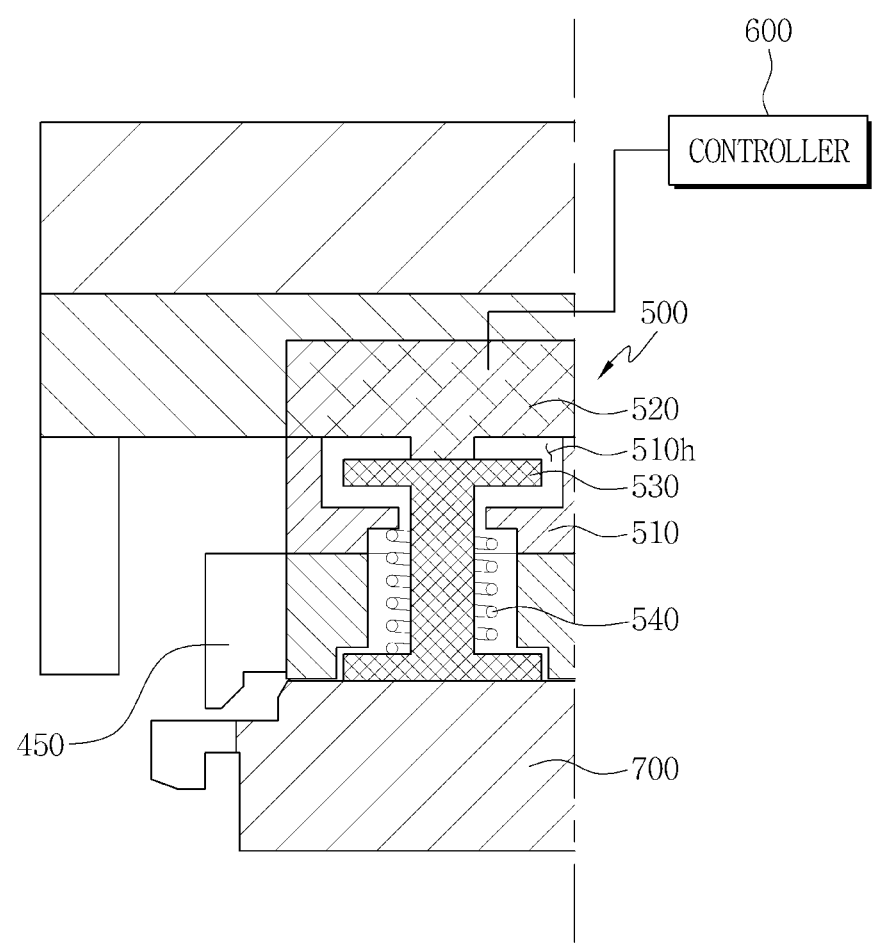
FIG. 8 is a cross-sectional view showing an expanded view of a location detection unit configuring a transfer unit of a test handler in accordance with embodiments of the inventive concept.

FIG. 2 is an exploded perspective view of a transfer unit 100 of the test handler 10 in accordance with an embodiment of the inventive concept. FIG. 3 is a partially cut perspective view of a floating assembly 300 of the transfer unit 100. FIG. 4 is a cross-sectional view of transfer unit 100 in accordance with the embodiment of the inventive concept. FIGS. 5A and 5B are cross-sectional views showing an expanded view of the floating assembly 300 of transfer unit 100 in accordance with the embodiment of the inventive concept. FIG. 6 is a plan view of the transfer unit 100 in accordance with an embodiment of the inventive concept. FIG. 7 is a front view of the transfer unit 100 in accordance with the embodiment of the inventive concept. FIG. 8 is a cross-sectional view showing an expanded view of a location detection unit 500 configuring the transfer unit 100, in accordance with the embodiment of the inventive concept.

Referring to FIGS. 2 to 6, the transfer unit 100 in accordance with the embodiment of the inventive concept may include a fixing part 200, the floating assembly 300, and an arm part 400.

The fixing part 200 may fix a test tray 700. The test tray 700 is prevented from being shaken or trembled when the transfer unit 100 moves while holding the test tray 700 or releases holding of the test tray 700. The test tray 700 may maintain a horizontal state by the fixing part 200 when the test tray 700 is being moved. The fixing part 200 may include a fixing plate 210 and a base frame 220.

The fixing plate 210 may have a plate shape. The fixing plate 210 may include a first side connected to a driving power supply device and a second side connected to the base frame 220. The second side of the fixing plate 210 may be opposite to the first side of the fixing plate 210. The driving power supply device may provide a driving power to move the transfer unit 100.

The base frame 220 may be a square or rectangular shape including an inner enclosed space 225. The base frame 220 may include inserted portions 221 and upper caps 222.

The inserted portions 221 may be disposed at the corners of the base frame 220, but is not limited thereto, and may be disposed at different positions which provide the intended features of the inventive concept as described herein. The inserted portions 221 may be disposed symmetric at opposite sides of the base frame 220.

Each of the inserted portions 221 may include a penetration hole 230 penetrating the inserted portion 221 of the frame 220 in a vertical direction (see, for example, FIGS. 5A-5B). The penetration hole 230 may have a cylinder shape. The inserted portion 221 may include an upper inserted portion 221a, a lower inserted portion 221b and a middle inserted portion 221c.

The upper inserted portion 221a may be disposed near an upper surface of the frame 220. The lower inserted portion 221b may be disposed near a lower surface of the frame 220. The lower inserted portion 221b may be located under the upper inserted portion 221a. An inner diameter of the lower inserted portion 221b may be different from an inner diameter of the upper inserted portion 221a. For example, the inner diameter of the lower inserted portion 221b may be smaller than the inner diameter of the upper inserted portion 221a.

The middle inserted portion 221c may be located between the upper inserted portion 221a and the lower inserted portion 221b. The middle inserted portion 221c may include a tapered surface. Inner side surfaces of the middle inserted portion 221c may be in contact with inner side surfaces of the upper inserted portion 221a and inner side surfaces of the lower inserted portion 221c. An inner diameter of the middle inserted portion 221c may be gradually reduced toward the lower inserted portion. A diameter of the penetration hole 230 may be reduced toward the lower inserted portion 221b in the middle inserted portion 221c.

The upper cap 222 may be located on the inserted portion 221. The upper cap 222 may cover the inserted portion 221. The upper cap 222 may seal the upper portion of the upper inserted portion 221a. The upper cap 222 may include a recess region 224. The recess region 224 may be disposed in a lower surface of the upper cap 222. The recess region 224 may be disposed above the penetration hole 230. A diameter of the recess region 224 may be smaller than the diameter of the penetration hole 230 in the upper inserted portion 221a.

The floating assembly 300 may be inserted in the penetration hole 230 of the inserted portion 221. The floating assembly 300 may move back and forth, left and right, and up and down in the penetration hole 230. The floating assembly 300 may rotate within a predetermined angle range in the penetration hole 230. The floating assembly 300 may include an elastic element 310, a floating part 320 and a coupling element 330.

The elastic element 310 may be located on the floating part 320. The elastic element 310 may be disposed between the upper cap 222 and the floating part 320. The elastic element 310 may be in contact with the upper cap 222.

The elastic element 310 may be fixed by the upper cap 222 and the floating part 320. An upper portion of the elastic element 310 may be fixed by the recess region 224 of the upper cap 222. The upper portion of the elastic element 310 may be inserted in the recess region 224. The elastic element 310 may press the floating part 320 with an elastic recovery force when the floating part 320 moves upward. The elastic element 310 may include an elastic material, and may be provided in the form of a spring.

The floating part 320 may be disposed between the elastic element 310 and the coupling element 330. The floating part 320 may be coupled the coupling element 330. The floating part 320 may include a body 322, a projection 325 and a protrusion 327.

The body 322 may be provided in a bar shape. The body 322 may include a female screw portion 322s. The female screw portion 322s may be disposed near a lower surface of the body 322. The female screw portion may be coupled to screws 330s of the coupling element 330.

The projection 325 may be disposed on side surfaces of the body 322. The projection 325 may protrude from the side surfaces of the body 322. The projection may be disposed in the upper inserted portion 221a. The projection may include a tapered surface facing the tapered surface of the middle inserted portion 221c. A maximum outer diameter of the projection 325 may be larger than a maximum inner diameter of the middle inserted portion 221c. The middle inserted portion 221c may prevent moving the projection to the lower inserted portion 221b by the elastic element 310.

The protrusion 327 may be disposed on an upper surface of the projection 325. The protrusion 327 may protrude from the upper surface of the body 322. The protrusion 327 may be inserted in the elastic element 310. A lower portion of the elastic element 310 may surround the protrusion 327. The lower portion of the elastic element 310 may be fixed by the protrusion 327.

The coupling element 330 may make the arm part 400 fixing on the floating part 320. The coupling element 330 may include a male screw portion 330s. The male screw portion 330s may be disposed near an upper surface of the coupling element 330. The male screw portion 330s may be coupled to the female screw portion 322s of the floating part 320.

The floating assembly 300 may further include a fixing pin 340. The fixing pin 340 may be a pin shape. The fixing pin 340 may be located at a side surface of the body 322. The fixing pin 340 may be inserted into the body 322 in a horizontal direction. The fixing pin 340 may be adhered to the arm part 400. The fixing pin 340 may prevent the arm part 400 from moving or shaking when the transfer unit 100 moves.

The arm part 400 may be coupled to the floating part 320. The arm part 400 may move back and forth, to left and right sides, and up and down by the floating part 320. The arm part 400 may rotate within a predetermined angle range by the floating part 320. The arm part 400 may include a picking element 410 and the arm base 450.

The arm base 450 may be a plate shape corresponding to the test tray 700. The arm base 450 may include an upper surface fixing the picking element 410, and a lower surface being in contact with the test tray 700 when holding the test tray 700. The arm base 450 may include a fixing hole 455 and mounting protrusions (453 of FIG. 9A).

The fixing hole 455 may penetrate the arm base 450 in a vertical direction. The fixing hole 455 may be disposed under the penetration hole 230. The coupling element 330 may couple the body 322 of the floating assembly 300 through the fixing hole 455. A diameter of the fixing hole 455 may be reduced toward an upper surface of the arm base 450. A diameter of a lower portion of the coupling element 330 may be increased toward a lower surface of the arm base 450. The arm base 450 may prevent the lower portion of the coupling element 330 from moving in the female screw portion 322s.

The mounting protrusions 453 may be located on the lower surface of the arm base 450. The mounting protrusions 453 may be disposed at locations corresponding to the semiconductor devices on the test tray 700. The mounting protrusions 453 may be disposed on the semiconductor devices of the test tray 700. The mounting protrusions 453 may be in contact with upper surfaces of the semiconductor devices. The mounting protrusions 453 may prevent the semiconductor devices from bouncing or shaking when the test tray 700 is moved.

The picking element 410 may hold the test tray 700. Each of the picking elements 410 may include a gripper driving cylinder 412, an LM block 414, a slide rail 418, a connection bar 420, a cam block 440, an LM plate 430, gripper guide rails 434, and grippers 448.

The gripper driving cylinder 412 may be located in the space 225 of the base frame 220. The gripper driving cylinder 412 may be fixed on the upper surface of the arm base 450. The gripper driving cylinder 412 may be connected to the LM block 414.

The LM block 414 may reciprocate by a predetermined distance. The LM block 414 may transfer the driving power of the gripper driving cylinder 412 to the connection bar 420. The connection bar 420 may be coupled to an upper surface of the LM block 414. The LM block 414 may include a LM block guide 416. The LM block guide 416 may be disposed on a lower surface of the LM block 414.

The slide rail 418 may be located in the space 225 of the base frame 220. The slide rail 418 may coupled to the LM block guide 416. The slide rail 418 may be coupled to the upper surface of the arm base 450. The slide rail 418 may be a single track rail. The LM block 414 may be coupled to the slide rail 418 via the LM block guide 416. The LM block 414 may move along the slide rail 418. For example, the slide rail 418 may extend in the X-axis direction (with respect to the configuration as illustrated in FIG. 2). The LM block 414 may reciprocate in X-axis direction along the slide rail 418.

The connection bar 420 may be located above the base frame 220. The connection bar 420 may be cross the base frame 220 in Y-axis direction (with respect to the configuration as illustrated in FIG. 2). The Y-axis direction is orthogonal to the X-axis direction. A lower surface of the connection bar 420 may be space apart from the upper surface of the base frame 220. The connection bar 420 may move in the X direction without being in contact with the upper surface of the base frame 220. The connection bar 420 may be coupled to the upper surface of the LM block 414. The connection bar 420 may include guide protrusions 422. The guide protrusions 422 may be disposed on opposite end portions of the connection bar 420. The guide protrusions 422 may be inserted in guide grooves 442 of the cam block 440 that will be described later. The connection bar 420 may be configured to reciprocate a predetermined distance along the guide grooves 442.

The gripper guide rails 434 may be located on outer portions of the base frame 220. The gripper guide rails 434 may be symmetrically disposed on opposite sides of the base frame 220. Each of the gripper guide rails 434 may be a single track rail. The gripper guide rails 434 may be coupled to the upper surface of the arm base 450. The gripper guide rails 434 may be configured so that the LM block 414 may reciprocate a predetermined distance in the Y-axis direction.

The LM plate 430 may be located on the gripper guide rails 434. The LM plate 430 is a plate elongated in the X-axis direction. The LM plate 430 may be located at an outer side of the base frame 220. The LM plate 430 may include LM plate guides 432, which may be disposed on opposite sides of the LM plate 430. The LM plate guides 432 may be coupled to the gripper guide rail 434 as illustrated, for example, in FIG. 2.

The cam block 440 may be located at a center portion of the LM plate 430. The cam block 440 may be disposed symmetrically in the Y-axis direction. The cam block 440 includes the guide groove 442. Each guide protrusion 422 of the connection bar 420 may be coupled to the respective guide groove 442. The guide grooves 442 may be curved grooves that are elongated in the X-axis direction. The guide protrusions 422 of the connection bar 420 may reciprocate along the curvature of the respective guide groove 442 of the cam block 440. The LM plates 430, coupled to the cam blocks 440, may be moved close to each other or moved apart from each other repeatedly.

The grippers 448 may be disposed on opposite sides of each LM plate 430. A lower portion of the grippers 448 may be bent. For example, the lower portion of the grippers 448 may be formed in the shape of an L, as illustrated in FIG. 2. The grippers 448 may be in contact with a lower surface of the test tray 700 when the test tray is moved. The test tray 700 may include tray groove portions 710, which may be disposed on the lower surface of the test tray 700. The grippers 448 may be inserted in respective ones of the tray groove portions 710 of the test tray 700. The grippers 448 may stably hold the test tray 700 by seating within the tray groove portions 710.

The transfer unit 100 of the present embodiment may further include the location detection part 500 and a controller 600, as illustrated in, for example, FIGS. 6-8.

The location detection parts 500 may determine whether the test tray 700 is disposed near the arm base 450. The location detection parts 500 may be located at corners of the arm base 450. The location detection parts 500 may be symmetrically disposed on the arm base 450. The location detection parts 500 may be disposed on outer ends of the gripper guide rails 434. Each of the location detection parts 500 may include a housing 510, a sensor 520 and a sensor dog 530 (see FIG. 8).

The housing 510 may be a box shape. The housing 510 may include a housing hole 510*h*, which may penetrate the housing 510. The housing hole 510*h* may be T-shaped. The sensor dog 530 may be inserted in the housing hole 510*h*. The housing 510 may protect the sensor dog 530 from external shock.

The sensor dog 530 may move in a vertical direction corresponding to movement of the transfer unit 100. A lower portion of the sensor dog 530 may be in contact with the upper surface of the test tray 700. The sensor dog 530 may be supported by a spring 540 in the housing 510.

The sensor 520 may be disposed on the housing 510. The sensor 520 may be in contact with an upper portion of the sensor dog 530. The sensor 520 may configured to detect whether the test tray 700 is adhered to the arm base 450 by being induced by the sensor dog 530. The sensor 520 may be electrically connected to the controller 600, as illustrated in FIG. 8. The sensor 520 may transmit an electric signal to the controller 600 when the test tray 700 is not held by the grippers 448.

The controller 600 may be electrically connected to the location detection unit 500. The controller 600 may be located in front of the test handler (10 of FIG. 1). The controller 600 may determine whether the test tray 700 is disposed near the lower surface of the arm base 450 according to the electric signal received from the sensor 520. The controller 600 may stop the operation of the transfer unit 100 when the test tray 700 is not disposed near the lower surface of the arm base 450. The controller 600 may generate an alarm sound or a warning light to signal the operation stop state of the transfer unit 100 in response to the test tray 700 not being disposed near the lower surface of the arm base 450.

FIGS. 9A to 9E are schematic diagrams showing operating states of the transfer unit 100 for holding the test tray 700. FIG. 10 is a cross-sectional view illustrating an operation of the floating assembly when the transfer unit 100, in accordance with an embodiment of the inventive concept, holds the test tray 700.

Operations of the transfer unit 100 according to an embodiment of the inventive concept in a case where the test tray 700 is stacked in the loading plate 750 in an inclined state in the X-axis direction, will be explained by referring to FIGS. 9A to 9E and 10.

Figure 9A:
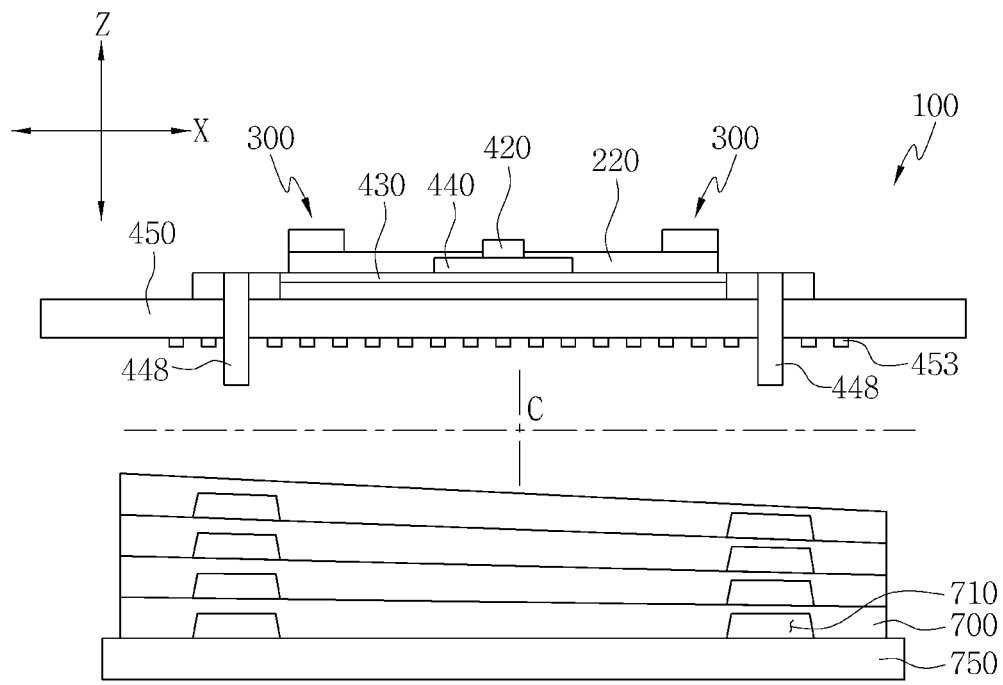
FIGS. 9A to 9E are schematic diagrams showing operating states for illustrating a way that a transfer unit of a test handler holds a test tray in accordance with embodiments of the inventive concept.
Figure 10:
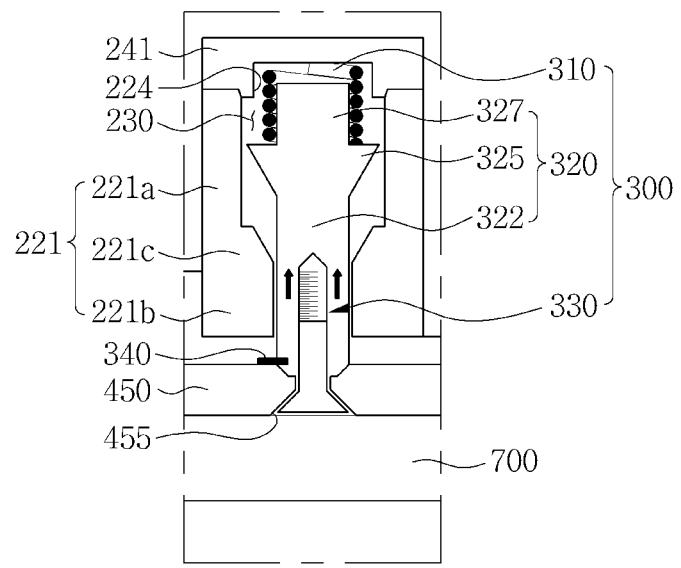
FIG. 10 is a cross-sectional view illustrating an operation of a floating assembly when a transfer unit of a test handler in accordance with embodiments of the inventive concept holds a test tray.

First, referring to FIG. 9A, the transfer unit 100 may be moved above the test tray 700 by a driving power transfer device. The test tray 700 may include semiconductor devices. The semiconductor devices may be mounded on the test tray 700.

Figure 9B:
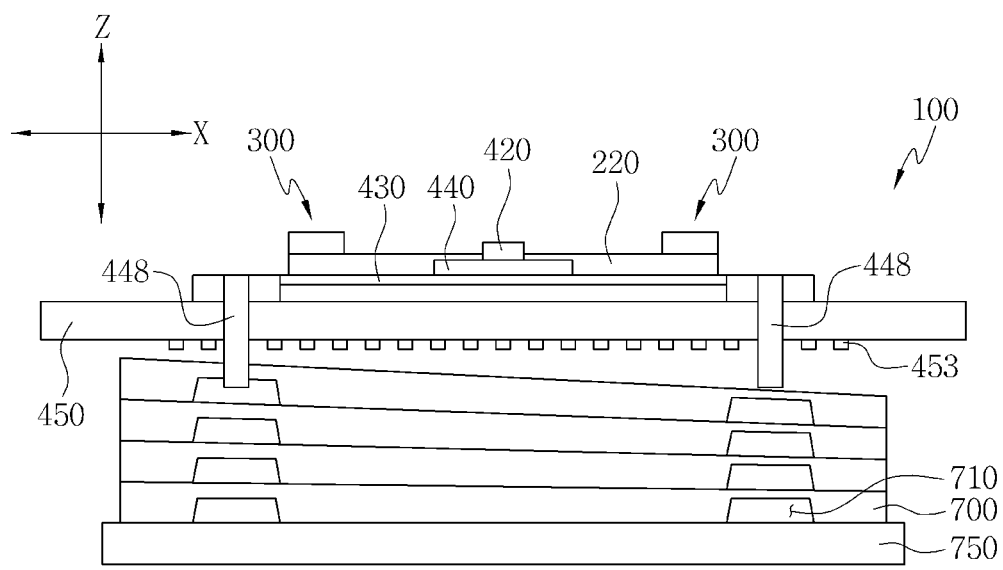

Next, as shown in FIG. 9B, the transfer unit 100 may be moved near the test tray 700.

Figure 9C:
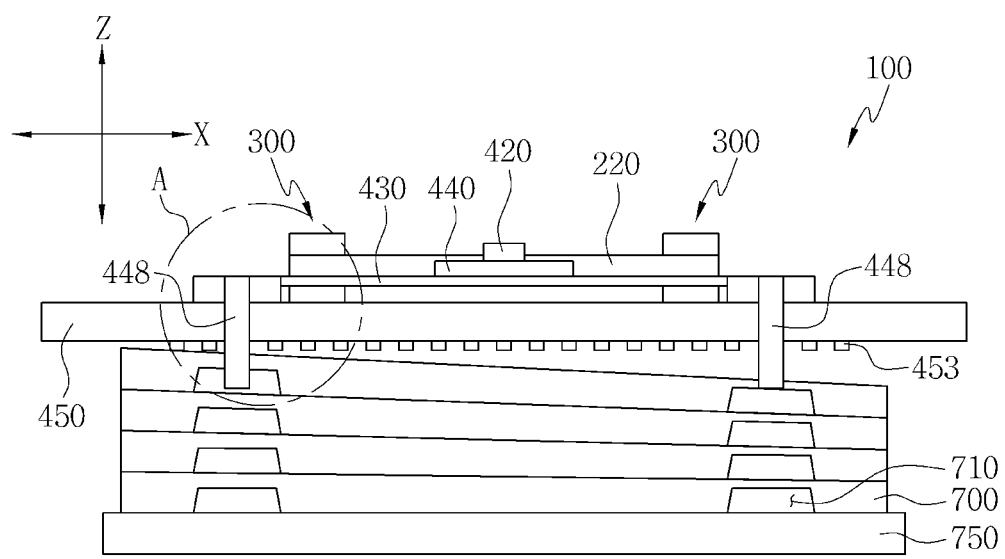

Next, as shown in FIG. 9C, the lower surface of the arm base 450 may be in contact with a part of the test tray 700, which is raised relatively higher than other portions. Here, a side (portion A of FIG. 9C) of the arm base 450, which is in contact with the test tray 700, may be vertically compressed upward by the test tray 700. The floating part 320 coupled to the arm base 450 may be moved upward due to the vertical pressure by the test tray 700, as shown in FIG. 10.

Figure 9D:
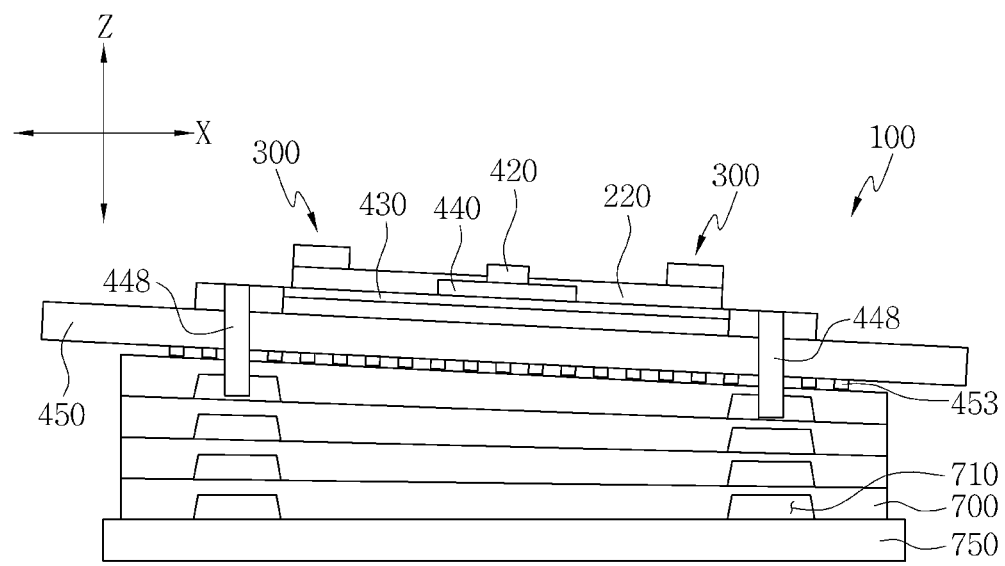

Next, as shown in FIG. 9D, the other side of the arm base 450, which was spaced apart from the test tray 700 in FIG. 9C, may be continuously moved down until the lower surface of the arm base 450 is in contact with the entire upper surface of the test tray 700. Here, the side (A of FIG. 9C) of the arm base 450 may be compressed by a vertical pressure continuously as the other side of the arm base 450 comes into contact with the test tray 700. The floating part 320 of the floating assembly 300 located at portion A of the arm base 450 may be moved upward continuously. Therefore, according to the transfer unit 100 of the present embodiment, the entire lower surface of the arm base 450 may evenly contact the upper surface of the test tray 700 without transferring excessive pressure to the semiconductor devices loaded on the test trays 700, and accordingly, fine cracks on the semiconductor device or damage to the test tray 700 can be prevented.

Next, after the lower surface of the arm base 450 is disposed near the upper surface of the test tray 700, the grippers 448 of the picking element 410 may be inserted in the tray groove portions 710. Here, according to the driving power transferring process shown in FIGS. 2 and 3, the gripper driving cylinder 412 may transfer the driving power to the LM blocks 414, and the LM blocks 414 receiving the driving power may move a predetermined distance in the X-axis direction along the slide rails 418. The driving power transferred to the LM block 414 may be transferred to the connection bar 420, and the guide grooves 422 coupled to the connection bar 420 may be moved along the guide grooves 442 of the cam block 420. Thus, the LM plates 430 may be moved inward a predetermined distance along the gripper guide rail 434 in connection with the movement of the guide protrusion 422. According to the movement of the LM plates 430, the grippers 448 may be inserted in the tray groove portions 710, and the transfer unit 100 may hold the test tray 700.

Figure 9E:
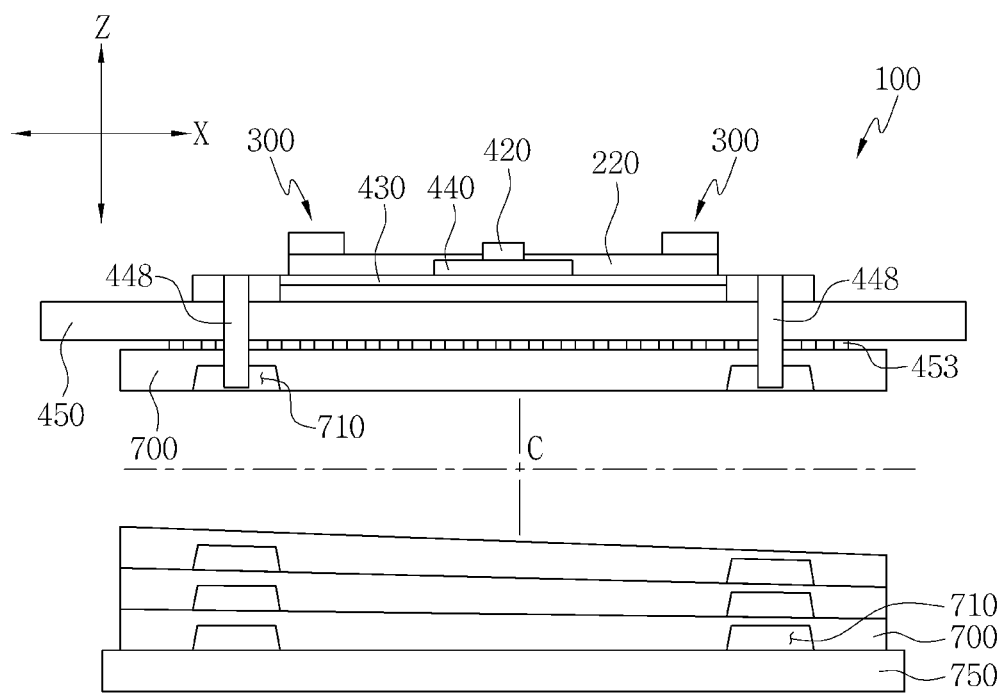

Next, as shown in FIG. 9E, the transfer unit 100 may move upward while holding the test tray 700 due to the driving power of the driving power transfer device. During the above process, the projection 325 of the floating part 320 (see FIG. 5A) may be fixedly mounted on the middle inserted portion 221*c* of the penetration hole 230 due to elastic recovery force of the elastic element 310 included in the floating assembly 300, and gravity of the arm base 450 and the test tray 700 themselves. The arm base 450 and the test tray 700 adhered to the arm base 450 may be located constantly on a virtual center axis C formed on the base frame 220 due to the elastic recovery force and gravity of themselves. Also, the test tray 700 may be moved while maintaining the horizontal state without movement due to shaking or trembling that is due to the elastic recovery force and gravity of themselves.

Next, the transfer unit 100 holding the test tray 700 is conveyed to a predetermined location of the supply unit (25 of FIG. 1), and the holding of the test tray 700 may be released from the transfer unit 100.

Meanwhile, in the above description of the operations of the transfer unit 100 for testing the semiconductor, the test tray 700 is inclined in a predetermined direction, that is, the X-axis direction; however, the inventive concept may be applied to a case where the test tray 700 is inclined in both directions, that is, the X-axis direction and the Y-axis direction. Also, an example of conveying the test tray 700 loaded on the loading unit 15 to the supply unit 25 by the transfer unit 100 is described above; however, the inventive concept may be applied to a case of conveying the test tray 700 loaded on the classification unit 45 to the loading unit 15.

Figure 11A:
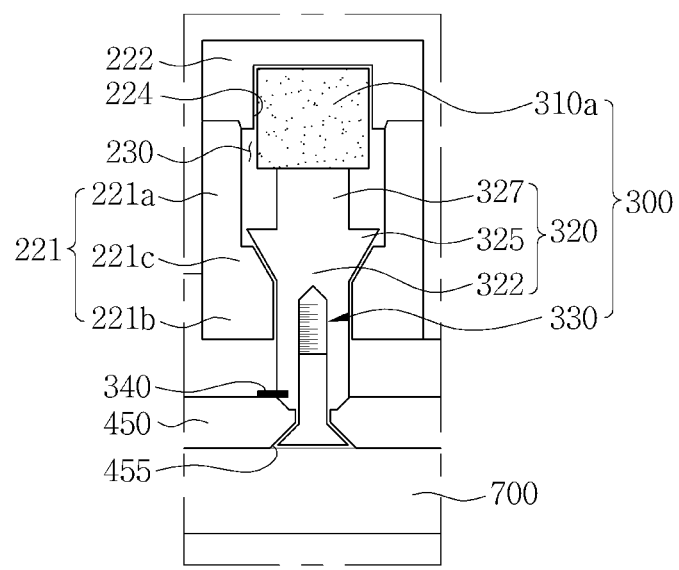
FIGS. 11A through 13 are conceptual cross-sectional views of floating assembly configuring a transfer unit of a test handler in accordance with embodiments of the inventive concept.
Figure 11B:
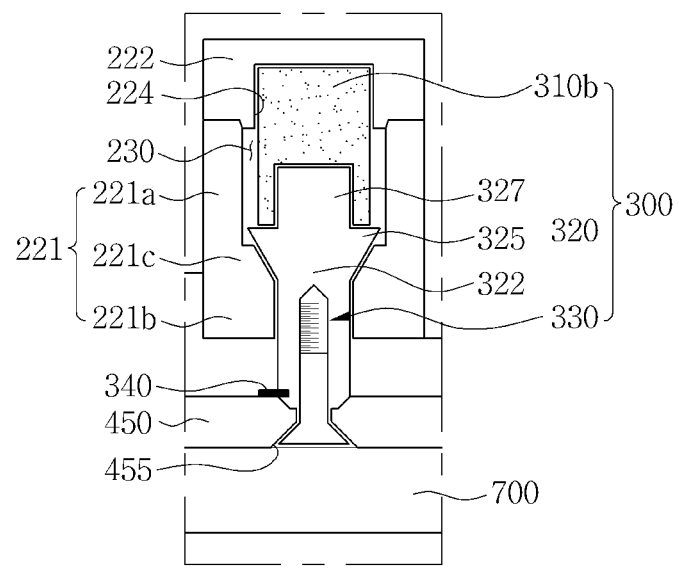
Figure 11C:
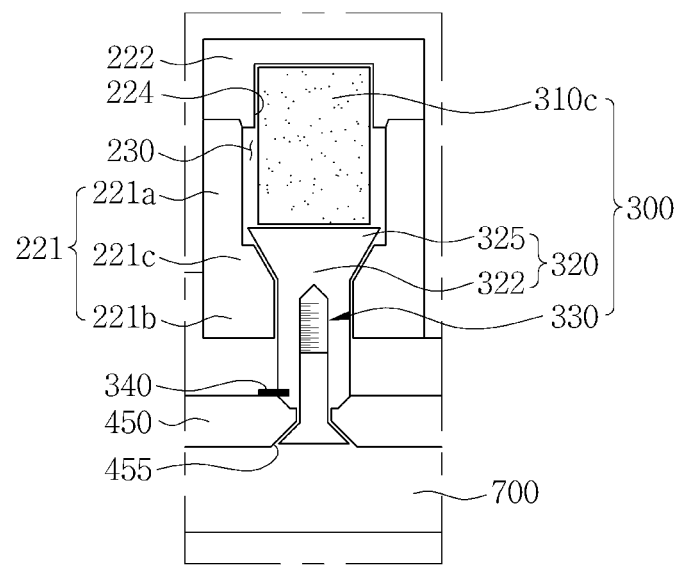

FIGS. 11A to 11C are longitudinal sectional views conceptually showing the inserted portion 221, the upper cap 222 and the floating assembly 300 in accordance with another embodiment of the inventive concept.

Referring to FIG. 11A, according to another embodiment of the inventive concept, the floating assembly 300 may include an elastic rubber 310a. The elastic rubber 310a may be disposed between the upper cap 222 and a protrusion 327 of a floating part 320. An upper portion of the elastic rubber 310a may fixed by a recess region 224 of the upper cap 222. A lower surface of the elastic rubber 310a may be in contact with an upper surface of the protrusion 327.

Referring to FIG. 11B, in another embodiment, the protrusion 327 may be inserted into the lower end surface of the elastic rubber 310b.

Referring to FIG. 11C, in another embodiment, the floating part 320 may include the body 322 and the projection 325. The elastic rubber 310c may be disposed between the upper cap 222 and the body 322 of a floating part 320. The elastic rubber 310c may be in contact with an upper surface of the body 322. The elastic rubber 310c may be fixed by the recess region 224 of the upper cap 222 and the body 322.

Figure 12A:
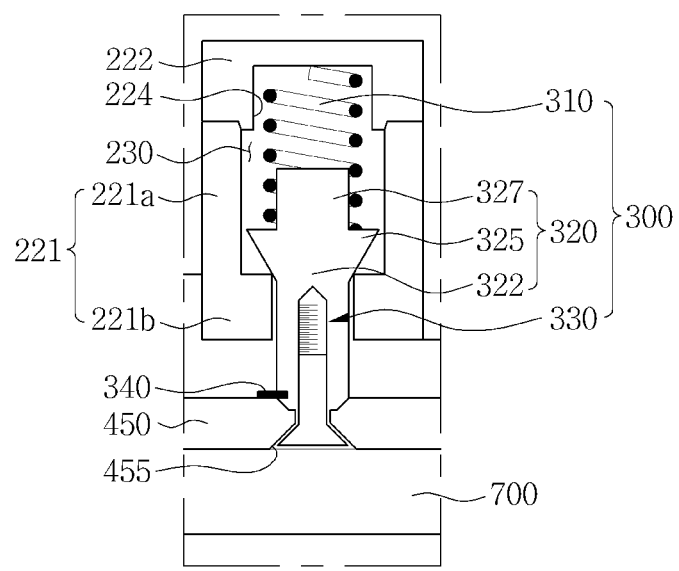
Figure 12B:
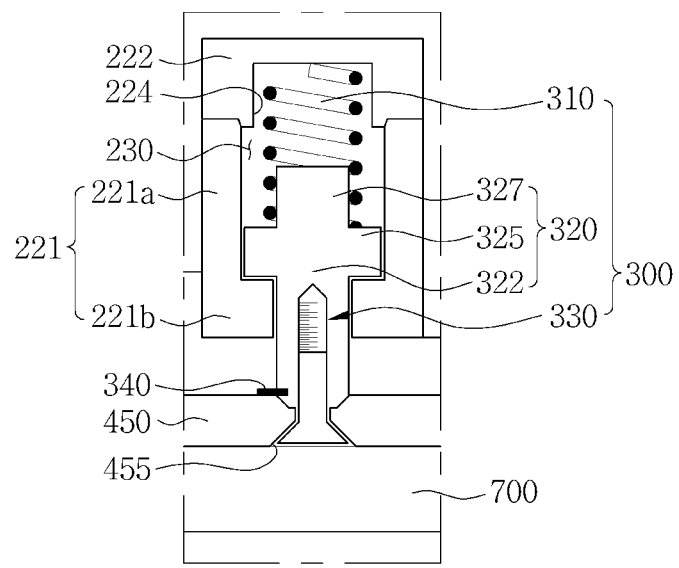
Figure 12C:
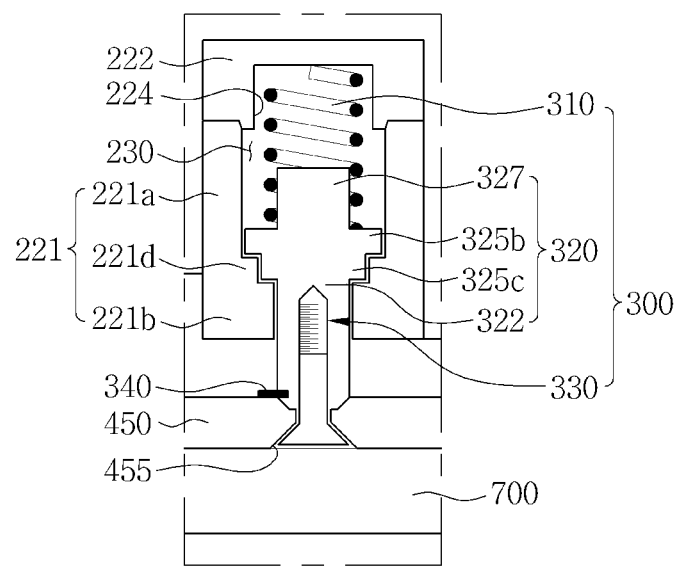

FIGS. 12A through 12C are longitudinal sectional views conceptually showing the inserted portion 221, the upper cap 222 and the floating assembly 300 in accordance with another embodiment of the inventive concept.

Referring to FIG. 12A, in another embodiment of the inventive concept, the inserted portion 221 may include an upper inserted portion 221a and a lower inserted portion 221b. The lower inserted portion 221b may have a diameter that is smaller than that of the upper inserted portion 221a. Projections 325 may be stopped by a boundary step between the upper inserted portion 221a and the lower inserted portion 221b.

Referring to FIG. 12B, in another embodiment of the inventive concept, the projection 325a may protrude from sides surface of the body 322 to a constant thickness. The projection 325a may not include a tapered surface.

Referring to FIG. 12C, in another embodiment of the inventive concept, the inserted portion 221 may include an upper inserted portion 221a, a lower inserted portion 221b, and a middle inserted portion 221d. The middle inserted portion 221d may be disposed between the upper inserted portion 221a and the lower inserted portion 221b. An inner diameter of the middle inserted portion 221d may be smaller than an inner diameter of the upper inserted portion 221a. An inner diameter of the lower inserted portion may be smaller than the inner diameter of the middle inserted portion 221d.

The floating part 320 may include the body 322, a first projection 325b, a second projection 325c, and the protrusion 327. The first projection 325b and the second projection 325c may be disposed on the sides of the body 322. The first projection 325b may be disposed near the protrusion 327. The first projection 325b may be disposed between the protrusion 327 and the second projection 325c. The first projection 325b may be disposed in the upper inserted portion 221a. The second projection 325c may be disposed in the middle inserted portion 221d.

An outer diameter of the first projection 325b may be larger than an outer diameter of the second projection 325c. The outer diameter of the first projection 325b may be larger than the inner diameter of the middle inserted portion 221d. The outer diameter of the second projection 325c may be smaller than the inner diameter of the middle inserted portion 221d.

Figure 13:
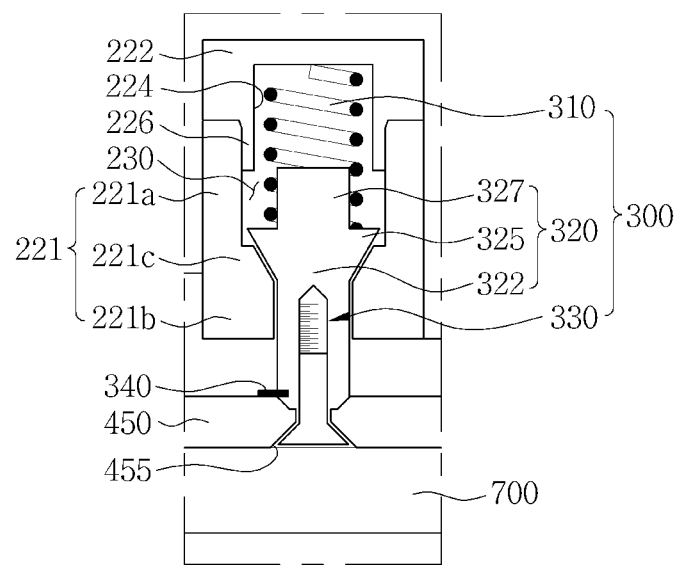

FIG. 13 is a longitudinal sectional view conceptually showing the inserted portion 221, the upper cap 222 and the floating assembly 300 in accordance with another embodiment of the inventive concept.

Referring to FIG. 13, in another embodiment of the inventive concept, the upper cap 222 may include the recess region 224 and a projection stopper 226. The projection stopper 226 may be expanded into a penetration hole 230 of the inserted portion 221. The projection stopper 226 may be disposed on inner side surfaces of the upper inserted portion 221a. The projection stopper 226 may expand a vertical distance of the recess region 224. Inner side surfaces of the projection stopper 226 may vertical align sides of the recess region 224. The projection stopper 226 may be contact with a projection of the floating part 320. The projection stopper 226 may restrict upward movement distance of the floating part 320.

According to the transfer unit of the test handler of the embodiments of the inventive concept, the test tray may be exactly held or the holding of the test tray may be released even in a state where the test tray is inclined, and thus, jamming or instant suspension or breakdown of equipment relating to operations of the transfer unit may be prevented.

Also, damage or defects caused by bouncing or falling of the semiconductor devices while conveying the test tray may be prevented, thereby improving a production yield.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A transfer unit of a test handler, the transfer unit comprising:
   a base frame including a first inserted portion, the first inserted portion including a penetration hole;
   a floating assembly inserted in the penetration hole of the base frame, the floating assembly including a floating part, an elastic element disposed on the floating part, and a coupling element coupling at a lower portion of the floating part; and
   an arm part coupled to the coupling element of the floating assembly,
   wherein the first inserted portion includes an upper inserted portion disposed near an upper surface of the first inserted portion, a lower inserted portion disposed near a lower portion of the first inserted portion, and a middle inserted portion disposed between the upper inserted portion and the lower inserted portion, an inner diameter of the upper inserted portion being larger than an inner diameter of the lower inserted portion, and the middle inserted portion having a tapered surface such that an inner diameter of the middle inserted portion gradually decreases towards the lower inserted portion, wherein the floating assembly is configured to move back and forth, left and right, and up and down, or configured to float within a predetermined angle range in the penetration hole, and wherein the base frame comprises an upper cap to cover upper portions of the penetration hole and the floating part, the elastic element is inserted into an inside of a recess region of the upper cap, and a diameter of the upper portion of the penetration hole is larger than a diameter of the inside of the recess region of the upper cap.

2. The transfer unit of claim 1, wherein the upper cap seals the upper inserted portion of the penetration hole.

3. The transfer unit of claim 2, wherein the upper cap comprises the recess region in a lower surface, and an upper portion of the elastic element is inserted in the recess region.

4. The transfer unit of claim 1, wherein the arm part comprises:
an arm base including an upper portion coupled to the floating assembly and a lower portion being in contact with a test tray, the arm base being plate shape; and
a picking element installed on the upper portion of the arm base to hold the test tray or to release holding of the test tray while reciprocating a predetermined distance,
wherein the arm base comprises a fixing hole, and the coupling element is coupled to the floating assembly through the fixing hole.

5. The transfer unit of claim 1, wherein the floating part comprises:
a body including a female screw portion coupled to the coupling element in a lower portion thereof; and
a first projection protruding from side surfaces of the body,
wherein an outer diameter of the first projection is larger than an inner diameter of the middle inserted portion.

6. The transfer unit of claim 5, wherein the floating part further comprises a protrusion disposed on an upper surface of the body, the protrusion supporting a lower portion of the elastic element.

7. The transfer unit of claim 5, wherein the first projection includes a tapered surface so that an outer diameter of the first projection is reduced downward.

8. The transfer unit of claim 5, wherein the floating part further comprises a second projection from side surfaces of the body, an outer diameter of the second projection is smaller than an outer diameter of the first projection, and is larger than the inner diameter of the lower inserted portion.

9. The transfer unit of claim 5, wherein an inner diameter of the middle inserted portion is larger than the inner diameter of the lower inserted portion, and is smaller than the outer diameter of the second projection.

10. The transfer unit of claim 5, wherein the floating part includes a fixing pin disposed at a side of the body, the fixing pin penetrating the body horizontally.

11. The transfer unit of claim 5, wherein the coupling element comprises a male screw portion coupled to the female screw portion of the body.

12. The transfer unit of claim 1, further comprising a second inserted portion symmetrical located on the base frame, the second inserted portion having the penetration hole.

13. The transfer unit of claim 1, wherein the elastic element is a spring.

14. A transfer unit of a test handler, the transfer unit comprising:
a base frame including inserted portions at opposite ends thereof, each inserted portion including a penetration hole;
a floating assembly inserted in each penetration hole, the floating assembly including a floating part, an elastic element disposed at an upper end of the floating part, and a coupling element coupling to a lower portion of the floating part such that the floating assembly moves in sideways and up and down directions within the respective penetration hole; and
an arm part coupled to the coupling element of each floating assembly such that the arm part adjusts a height of each of four sides individually and is capable of moving in sideway directions when making contact with a test tray to be picked up and transferred,
wherein the base frame comprises an upper cap to cover upper portions of the penetration hole and the floating part, the elastic element is inserted into an inside of a recess region of the upper cap, and a diameter of the upper portion of the penetration hole is larger than a diameter of the inside of the recess region of the upper cap,
wherein each inserted portion includes an upper inserted portion disposed near an upper surface of the first inserted portion, a lower inserted portion disposed near a lower portion of the first inserted portion, and a middle inserted portion disposed between the upper inserted portion and the lower inserted portion, an inner diameter of the upper inserted portion being larger than an inner diameter of the lower inserted portion, and the middle inserted portion having a tapered surface such that an inner diameter of the middle inserted portion gradually decreases towards the lower inserted portion.

15. The transfer unit of claim 14, wherein each of the inserted portions is disposed at each of four corners of the base frame.

16. The transfer unit of claim 14, wherein the arm part comprises:
an arm base including an upper portion coupled to the floating assembly via the respective coupling element, and a lower portion to contact a test tray, the arm base having a plate shape;
picking elements installed on the upper portion of the arm base to hold the test tray or to release holding of the test tray while reciprocating a predetermined distance; and
guide rails in which the picking elements reciprocate.

* * * * *